United States Patent [19]

McSpadden

[11] 4,216,540

[45] Aug. 5, 1980

[54] PROGRAMMABLE POLYNOMIAL GENERATOR

[75] Inventor: Jeff R. McSpadden, Isanti, Minn.

[73] Assignee: Control Data Corporation, Minneapolis, Minn.

[21] Appl. No.: 959,290

[22] Filed: Nov. 9, 1978

[51] Int. Cl.$^2$ ............................................. G06F 11/12
[52] U.S. Cl. ...................................................... 371/37
[58] Field of Search ........... 340/146.1 AL, 146.1 AV, 340/146.1 A

[56] References Cited

U.S. PATENT DOCUMENTS

| | | | |
|---|---|---|---|
| 3,534,331 | 10/1970 | Kautz | 340/146.1 AL |
| 3,678,469 | 7/1972 | Freeman et al. | 340/146.1 AL |
| 3,703,705 | 11/1972 | Patel | 340/146.1 AL |
| 3,866,170 | 2/1975 | Verzocchi | 340/146.1 AL |
| 3,872,430 | 3/1975 | Boudreau et al. | 340/146.1 AL |
| 4,001,779 | 1/1977 | Schiff | 340/146.1 AV |

*Primary Examiner*—Charles E. Atkinson
*Attorney, Agent, or Firm*—William J. McGinnis, Jr.

[57] ABSTRACT

A polynomial generator for use in an error code correction system consists of an input data multiplexer for determining the mode of operation, a plurality of polynomial enable gates to allow insertion of a predetermined polynomial, a plurality of check character generating gates divided into a first group and a second group for forming an output polynomial from the input data and the predetermined polynomial, an output holding register and a pair of decode gates for constantly monitoring the contents of the holding register to provide an indication of either of two particular conditions.

4 Claims, 1 Drawing Figure

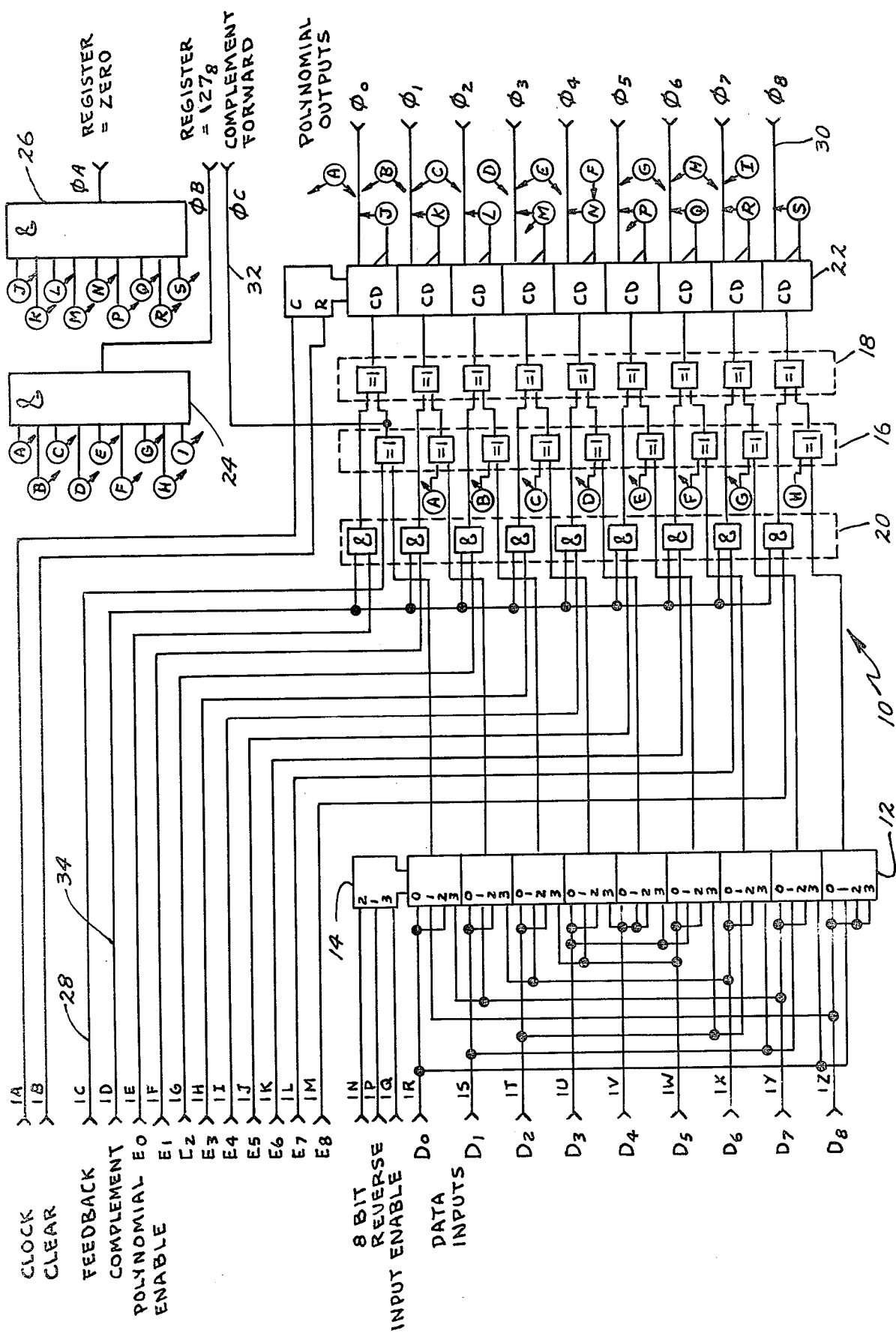

4,216,540

PROGRAMMABLE POLYNOMIAL GENERATOR

BACKGROUND OF THE INVENTION

This invention is related to the field of error detection and correction systems. In such systems a redundant check character is added to a data stream at the source as an aid to the receiving device to detect and correct errors in the transmission system. Fundamental to such systems is the process by which a known mathematical relationship in the form of a polynomial is transformed into the given redundant check code which is inserted into the data stream. Generally, this process is performed using a cyclic shift technique wherein the data and a residue check character are half added together and certain bits are inverted to form a new residue check code. The process is repeated until all data bits in the data stream have been processed. The final residue check code then becomes the check code added to the data stream. This invention is a device for generating the check codes to be added to the data stream in such a system.

Significant in the prior art known to applicant is U.S. Pat. No. 3,811,108 showing an error code generating device which may be used for reverse error identification. The present invention differs from that shown in the patent to the extent that it may be adjustable for data fields of different lengths in both the forward and reverse directions whereas the patent shows a device which is reversible with a standard length data field. Further, the present invention differs from the device shown in the patent in the way in which the generator polynomial may be entered and altered at will thus making it programmable. U.S. Pat. No. 4,001,779 shows an error correcting system which requires an extra shift in the presence of a code word containing all zeros which is not necessary in the present invention. Other relevant United States patents known to applicant are: U.S. Pat. Nos. 3,678,469; 3,866,170; 3,703,705 and 3,872,430.

SUMMARY OF THE INVENTION

The present invention is shown in a preferred embodiment using AND gates and EXCLUSIVE OR gates in the logic system. This however should not be considered restrictive of the invention because the invention may be practiced using other logic systems and the types of gates that form the logical analog elements to AND gates and EXCLUSIVE OR gates.

All input operands in the present invention are received by an input data multiplexer. This data multiplexer receives a control signal which indicates the mode of operation of the device as to whether it is in forward or reverse modes or the length of the data field. The multiplexer accordingly adjusts the paths of the particular bits of the received input operand accordingly. The given or generating polynomial to be used is received through a plurality of polynomial enable gates which are AND gates, in this form of the invention, and thus characterize the circuit for the treatment to be given the input data in generating a check character. A plurality of check character generating gates are provided and formed into a first group and a second group. In this embodiment of the invention these gates are EXCLUSIVE OR gates. The first group of EXCLUSIVE OR gates receives an output from the input data multiplexer. The second group of EXCLUSIVE OR gates receives a first input from a polynomial enable gate and a second output from an EXCLUSIVE OR gate of the first group associated therewith. The outputs of the second group of EXCLUSIVE OR gates forms the input to an output holding register. An output from each respective gate of the output holding register provides an input to an EXCLUSIVE OR gate of the first group associated with an adjacent bit position.

IN THE FIGURE

The single drawing FIGURE is a block schematic diagram of the logic elements comprising a preferred embodiment of the present invention.

DESCRIPTION OF THE PREFERRED EMBODIMENT

Referring to the single drawing FIGURE, a programmable polynomial check code generator 10 according to the present invention is shown. Data inputs are provided as input terminals D0 through D8 as shown at the left hand side of the FIGURE for the respective operand bits. These inputs are connected to the various input terminals of an input data multiplexer 12 in a multiplex fashion so that an appropriate input control signal, or the absence of a control signal, to the multiplexer controller 14 causes the selection of the appropriate input for each of the given output positions represented by the multiplexer. Each of these nine outputs from the input data multiplexer is shown connected to one of the input terminals of an associated one of nine EXCLUSIVE OR gates forming a first group of check character generating gates 16, as shown in dashed lines in the FIGURE. The output of each EXCLUSIVE OR gate of the group of gates 16 forms one input to an associated EXCLUSIVE OR gate in a second group of check character generating gates 18, shown in dashed lines in the FIGURE.

The control input to the input data multiplexer 12 is shown and labeled as "8 bit", "reverse" and "input enable". These three control inputs cause the data multiplexer to select a signal output from four possible combinations of data inputs. The predetermined polynomial is entered into the generator through input terminals E0 through E8 shown at the upper left hand side of the FIGURE. These polynomial bits are provided to a plurality of polynomial enable gates 20 shown in dashed lines in the FIGURE which are AND gates in this embodiment of the invention. These AND gates each have as an input one bit of the predetermined polynomial which governs the system together with the control input received at the "complement" input line shown at the upper left hand corner of the FIGURE. The outputs of each of the AND gates forms the second input to an associated EXCLUSIVE OR gate of the second group of check character generating gates 18. The output of each of the EXCLUSIVE OR gates of the second group 18 forms an input to an output data holding register 22. The output data holding register 22 has for each bit an output equivalent to the bit and its logical opposite. The direct output of each bit forms the second input to an EXCLUSIVE OR gate of the first group of check character generating gates, but for an adjacent bit position of the operand in the data stream. A second output of the data bit in the holding register 22 is connected to an AND gate 24 which forms a decode element to indicate a particular condition of the output signal. The NOT output of all the bits in the holding register is used as an input to another AND gate 26 which is used to determine when the contents of the output holding register is all binary zeros. The holding register 22 is controlled by input control lines labeled "CLOCK" and "CLEAR" which performs the indicated functions. A large system according to the present invention may be built up of units as shown in the FIGURE for operands of different lengths by connecting them together for larger operands of any given length. The feedback input signal control line 28 on the first or highest ordered element in a series of similar elements will be the polynomial output bit of the last device in a series of such devices. The feedback input signal 28 on any other chip will be the polynomial output bit of the previous chip. Thus, the output line 30 of one device will be connected as an input line to input 28 of the next device.

The output check character code is formed in the following fashion. At the leading edge of the clock signal, the residue check code is transferred into the holding register 22. The clock signal will be at the same frequency as the data bits. The residue check code is held in the holding register until either another clock pulse updates the residue clear signal clears the register.

The complement forward output signal 32 of each device will be used to feed the complement input signal 34 of all subsequent devices in the series. This signal is used to determine when a particular bit of the polynomial character is inverted.

A cyclic code or residue is generated in the following manner according to the present invention.

First, a clear signal is presented to clear the holding register 22.

Then, polynomial enables, E0 to E8, are set up for the polynomial desired. These terms will remain on the ENABLE lines until the entire block of data is supplied. The AND gates 20 are used to control the polynomial enables in an expanded system. In an expanded system the first stage will have the COMPLEMENT input as a logical one. The succeeding stages will have the COMPLEMENT input connected to the COMPLEMENT FORWARD output of the previous stage. In the first stage the FEEDBACK input is connected to the highest order output of the HOLDING REGISTER of the last stage. The succeeding stages will have the FEEDBACK input connected to the highest order output of the HOLDING REGISTER of the previous stage.

Along with the POLYNOMIAL ENABLES, the control signals are set up for the DATA MULTIPLEXER. These signals will remain active until the entire block of data is inputted. The ENABLE input will cause data to be passed through the MULTIPLEXER as directed by the other control inputs. The absence of this input will cause logical zeros at the output of the DATA MULTIPLEXER. This is used for shifting a residue without data in track identification. The REVERSE input will cause the DATA inputs, D0 to D8, to be reversed (i.e., D8 to D0). The 8 BIT input will cause the data to be reversed on an 8 BIT basis (i.e., D7 to D0).

The preceding should not be considered restrictive if the POLYNOMIAL ENABLES and the DATA MULTIPLEXER control signals need to be changed in the middle of a block for a particular coding scheme.

After the other inputs are set up, the data bits are inputted at the DATA inputs, D0 to D8. In serial mode only D0 is used and in parallel mode all data inputs are used. In serial mode all data is shifted to the proper location before proceeding to the next step.

The output of the DATA MULTIPLEXER 12 in the first group of EXCLUSIVE OR gates 16 is half added to the shifted output of the HOLDING REGISTER 22. On the first frame of data the HOLDING REGISTER is all zero and this stage performs no operation. The output of the first group of EXCLUSIVE OR gates, 16, is then half added to the POLYNOMIAL ENABLE gates, 20, in the second group of EXCLUSIVE OR gates, 18. The second group of EXCLUSIVE OR gates provide a logical inversion depending on the POLYNOMIAL ENABLE inputs and the FEEDBACK input.

A clock signal is supplied when the CLOCK input switches from a logical zero to a logical one. The output of the second group of EXCLUSIVE OR gates are latched in the HOLDING REGISTER with the clock signal.

The output of the HOLDING REGISTER is fed back to the next higher order bit in the first group of EXCLUSIVE OR gates to await the next frame (parallel mode) or bit (serial mode) of data and accompanying clock signal.

This process of data input, clock, shift is repeated for each data frame until the entire block has been inputted. At the end of a data block, the HOLDING REGISTER will contain the cyclic code if this system is on the sending end or will contain a residue if this system is on the receiving end.

What is claimed is:

1. A programmable polynomial generator for use in error correction systems comprising:

means for receiving a plurality of polynomial enable input signals representing an input polynomial, means for receiving input data signals representing bits of an input operand, a data input multiplexer connected to said means for receiving input data signals for selectively multiplexing said signals in a particular pattern from a predetermined number of patterns, a plurality of polynomial enable gates adapted to respond to at least one control signal, said each of gates being connected to said means for receiving a plurality of polynomial enable input signals a plurality of check character generating gates, each of said gates being connected to receive signals from said data input multiplexer and from an associated one of said polynomial enable gates, a holding register adapted to respond to at least one control signal connected for receiving signals from each of said plurality of check character generating gates, a first decode gate connected to the output signals of said holding register to provide a decode signal if the contents of said register is all zero, and a second decode gate connected to receive output signals from said holding register to provide a decode signal if the contents of said register are a predetermined quantity.

2. The device of claim 1 wherein said plurality of check character generating gates are formed in a first group and a second group, said first group of said check character generating gates receiving an input from said data input multiplexer, and said second group of said check character generating gates receiving first input from said polynomial enable gates and a second input from said first group of said check character generating gates.

3. The device of claim 2 wherein said first group of check character generating gates receives a first input from said data input multiplexer and a second input from said holding register.

4. The device of claim 3 where the second input to said first group of check character generating gates is the same as the input to the second decode gate.

* * * * *